(12) United States Patent
Takahashi et al.

(10) Patent No.: US 10,517,186 B2
(45) Date of Patent: Dec. 24, 2019

(54) SOCKET

(71) Applicant: Sensata Technologies, Inc., Attleboro, MA (US)

(72) Inventors: Hideyuki Takahashi, Fuji (JP); Hideki Sano, Gotemba (JP)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 16/108,585

(22) Filed: Aug. 22, 2018

(65) Prior Publication Data

US 2019/0064214 A1 Feb. 28, 2019

(30) Foreign Application Priority Data

Aug. 23, 2017 (JP) ................................. 2017-160008

(51) Int. Cl.
*G01R 1/04* (2006.01)
*H01R 12/71* (2011.01)
(Continued)

(52) U.S. Cl.
CPC ......... *H05K 7/1061* (2013.01); *G01R 1/0466* (2013.01); *G01R 1/0483* (2013.01);
(Continued)

(58) Field of Classification Search
CPC .............. H05K 7/1061; H05K 7/1007; H05K 2201/10325; H05K 2201/10424;
(Continued)

(56) References Cited

U.S. PATENT DOCUMENTS 4,080,027 A 3/1978 Benasutti
5,118,311 A 6/1992 Margini
(Continued)

FOREIGN PATENT DOCUMENTS

CN 101627508 1/2010
CN 102593675 7/2012
(Continued)

OTHER PUBLICATIONS

Search Report from related United Kingdom Application No. GB1813689.5 dated Jan. 15, 2019.

*Primary Examiner* — James Harvey
*Assistant Examiner* — Matthew T Dzierzynski
(74) *Attorney, Agent, or Firm* — Burns & Levinson LLP; George N. Chaclas; Marlo Schepper Grolnic

(57) ABSTRACT

A surface-mountable socket has a wiping function. A socket 100 of the present technology can be surface-mounted to a board 210. The socket 100 includes a plurality of contacts 110, and each contact 110 includes a contact portion 112 that can contact a terminal of a semiconductor device, a locking portion 116 connected to the contact portion 112, and a board-side contact portion 118 that extends from the locking portion 116 and can contact a conductive region formed on a board surface. The socket 100 further includes a stopper member 120 that holds the locking portion 116 of the plurality of contacts 110 and a guide member 180 that is disposed so as to oppose the stopper member 120, and the guide member 180 is formed with a plurality of through holes 184 that houses a board-side contact 118 protruding from the stopper member.

15 Claims, 15 Drawing Sheets

(51) Int. Cl.
*H05K 7/10* (2006.01)
*H01R 13/506* (2006.01)

(52) U.S. Cl.
CPC ......... *H01R 12/716* (2013.01); *H01R 13/506* (2013.01); *H05K 7/1023* (2013.01)

(58) Field of Classification Search
CPC . H05K 2201/10568; H05K 2201/1059; H05K 2201/10598; H05K 2201/10787; H05K 3/20; H05K 3/306; H05K 3/308; H05K 3/4015; H05K 7/1069; H05K 7/1084; H01R 12/58; H01R 12/7082; H01R 12/88; H01R 13/24; H01R 2201/20; H01R 12/52; H01R 12/57; H01R 12/585; H01R 12/7005; H01R 12/7023; H01R 12/7076; H01R 12/714; H01R 12/721; H01R 12/89; H01R 13/193; H01R 13/2407; H01R 13/2414; H01R 13/2435; H01R 13/2464; H01R 13/62988
See application file for complete search history.

(56) References Cited

U.S. PATENT DOCUMENTS

| | | | |
|---|---|---|---|
| 5,277,607 A | 1/1994 | Thumma et al. | |
| 5,308,249 A | 5/1994 | Renn et al. | |
| 5,387,134 A | 2/1995 | Bryce et al. | |
| 5,427,553 A | 6/1995 | Tsuji | |
| 5,443,394 A | 8/1995 | Billman et al. | |
| 5,676,559 A | 10/1997 | Laub et al. | |
| 5,800,186 A | 9/1998 | Ramirez et al. | |
| 6,666,691 B2 | 12/2003 | Ikeya | |
| 6,743,034 B2 | 6/2004 | Shimada | |
| 6,790,065 B2 | 9/2004 | Fukunaga | |
| 6,848,928 B2 | 2/2005 | Ikeya et al. | |
| 7,021,954 B2 | 4/2006 | Gattuso et al. | |
| 7,200,930 B2 * | 4/2007 | Khandros | B23K 20/004 29/860 |
| 7,288,005 B2 | 10/2007 | Nagahashi | |
| 7,410,382 B2 | 8/2008 | Wu | |
| 7,462,056 B2 * | 12/2008 | Yeh | H01R 12/58 439/331 |
| 7,651,366 B2 | 1/2010 | Ringler et al. | |
| 7,666,016 B2 | 2/2010 | Kobayashi | |
| 7,887,355 B2 | 2/2011 | Watanabe | |
| 7,956,631 B2 * | 6/2011 | Chen | G01R 1/07357 324/754.08 |
| 7,976,326 B2 | 7/2011 | Stoner | |
| 8,197,290 B2 * | 6/2012 | Koyama | H01R 13/2428 439/474 |
| 8,272,882 B2 * | 9/2012 | Sakai | G01R 1/0466 439/268 |
| 8,385,080 B2 | 2/2013 | Kim et al. | |
| 8,388,365 B2 | 3/2013 | Takahashi et al. | |
| 8,535,079 B2 | 9/2013 | Wang et al. | |
| 8,840,406 B2 | 9/2014 | Hirata | |
| 9,368,893 B2 * | 6/2016 | Koyama | H01R 13/2428 |
| 9,692,156 B2 * | 6/2017 | Matsumoto | H01R 13/03 |
| 9,761,980 B2 * | 9/2017 | Zeng | H01R 13/2407 |
| 9,979,150 B2 * | 5/2018 | Hwang | H01R 12/7076 |
| 10,079,443 B2 * | 9/2018 | Costello | H01R 13/2442 |
| 2002/0155735 A1 | 10/2002 | Zhou et al. | |
| 2002/0182919 A1 | 12/2002 | Watanabe | |
| 2007/0249207 A1 | 10/2007 | Yeh et al. | |
| 2011/0201221 A1 | 8/2011 | Kobayashi | |
| 2018/0115101 A1 * | 4/2018 | Oda | G01R 1/073 |
| 2018/0287279 A1 * | 10/2018 | Taguchi | H01R 13/2442 |

FOREIGN PATENT DOCUMENTS

| | | |
|---|---|---|
| CN | 202601895 | 12/2012 |
| CN | 203312562 | 11/2013 |
| EP | 2530791 | 12/2012 |
| JP | 2000173699 | 6/2000 |
| JP | 200110532 | 4/2001 |
| JP | 2002298998 | 10/2002 |
| JP | 3737078 | 1/2006 |
| JP | 2007317623 | 12/2007 |
| JP | 4173155 | 10/2008 |
| JP | 2013-113753 A | 6/2013 |
| JP | 5253016 | 7/2013 |

* cited by examiner

190

(A)

(B)

SOCKET

CROSS-REFERENCE TO RELATED APPLICATION

This application claims priority to Japanese Patent Application No. JP2017-160008, filed Aug. 23, 2017, which is incorporated herein by reference.

BACKGROUND OF THE INVENTION

Field

The present technology relates to a socket for mounting a BGA (ball grid array) semiconductor device, a CSP (chip-scale package) semiconductor device, an LGA (land grid array) semiconductor device, or another semiconductor device and relates particularly to a structure for mounting a socket to a circuit board.

Background

A socket is widely used as an interface for electrically connecting a semiconductor device and a circuit board or the like. For example, as illustrated in FIG. 1, a socket 10 illustrated in patent literature 1 has a base member 20, a cover member 30 that can reciprocate in a direction heading toward or away from the base member 20, a plurality of contacts 40 implanted in the base member 20, a contact regulating member 50 that regulates a position of another end of the contact 40, an adapter 60 that can reciprocate relative to the contact regulating member 50, and a latch member 70 that presses a surface of a BGA. When the adapter 60 is moved toward the contact regulating member 50, solder balls 11 of a BGA device placed on the adapter 60 respectively connect to another end 42 of each contact protruding from each through hole 65 of the adapter 60. As illustrated in FIG. 2, the contact 40 includes a curved elastically deforming portion 44 between one end 41 and the other end 42 and gives rise to an elastic force by the elastically deforming portion 44. Moreover, a socket 10A illustrated in patent literature 2 is provided with a guide mechanism 78 for guiding movement of the latch member 70 in a vertical direction.

SUMMARY

In performing a test such as a burn-in of the semiconductor device, first, the socket is mounted on the circuit board, and next, the semiconductor device is mounted in the socket. FIG. 4 illustrates a socket 10B of a through-hole type. The contact regulating member 50 is installed to the base member 20 in a central opening. A plurality of through holes is formed in the contact regulating member 50, and one end portion of the contact 40 of a straight shape extends from a bottom portion of the socket 10B to the outside via the through hole of the contact regulating member 50. Moreover, a post member 42 is provided at each corner of the base member 20; the post member 42 is inserted into a positioning hole of the circuit board such that the two are positioned. As illustrated in FIG. 5, one end of the contact 40 is inserted into a through hole 92 of a circuit board 90, and the contact 40 is electrically connected to a conductive land or a wiring pattern of the circuit board by solder 92.

Because the socket 10B is soldered to the circuit board 90, there is a problem where replacement is time-consuming when the socket 10B fails. As a countermeasure to this, there is a method of using a socket of a surface-mounted type using a probe pin, but this type of socket is expensive compared to a soldered type. Moreover, as illustrated in FIG. 6, this surface-mounted type of socket connects a probe pin 96 to an Au-plated pad 98 formed in a through hole of the circuit board 90 but has a problem where contact failure readily arises when foreign matter or dirt is adhered to on the pad 98. Moreover, because a socket of a through-hole type and a socket of a surface-mounted type each require a dedicated board, the same circuit board cannot be shared.

The present technology has as an object to solve these conventional problems and provide a surface-mountable socket provided with a wiping function.

A socket of the present technology can be surface-mounted to a board and has a plurality of contacts configured from a conductive material, each contact including a contact portion that can contact a terminal of a semiconductor device, a locking portion connected to the contact portion, and a board-side contact portion that extends from the locking portion and can contact a conductive region formed on a board surface; a holding member that holds the locking portion of the plurality of contacts; and a guide member that is disposed so as to oppose the holding member and is formed with a plurality of through holes into which the board-side contact portion of the contact, which protrudes from the holding member, is inserted, the guide member being able to move in a direction heading toward or away from the holding member.

In a certain embodiment, the board-side contact portion moves in an axial direction and a direction perpendicular to the axial direction when a force is received in the axial direction. In a certain embodiment, the board-side contact portion rotates and moves. In a certain embodiment, the board-side contact portion includes an elastically deforming portion connected to the locking portion and a curved portion connected to the elastically deforming portion. In a certain embodiment, the board-side contact portion rotates and moves with the elastically deforming portion as a fulcrum. In a certain embodiment, the board-side contact portion is larger than a diameter of a through hole of the board. In a certain embodiment, a centre of the board-side contact portion is offset from a centre of the through hole of the board. In a certain embodiment, a curvature radius of the board-side contact portion is greater than a radius of the through hole of the board. In a certain embodiment, the board-side contact portion includes a portion with a relatively narrow width. In a certain embodiment, a material equally soft as or softer than a material plating a through hole of the board or the board surface of the through hole is selected as a material plating a surface of the board-side contact portion. In a certain embodiment, the board-side contact portion is Ag plating, and the through hole of the board is Au plating. In a certain embodiment, the socket further includes a spring means of biasing the guide member in the direction heading away from the holding member.

A mounting device of the present technology includes the socket of any one of the above configurations and a board whereto the socket is surface-mounted. In a certain embodiment, the mounting device is a device for testing. In a certain embodiment, the board-side contact portion makes multiple contact with an edge portion of the through hole of the board.

The present technology can provide a socket of a surface-mounted type to an existing through-hole-type board. Because a component configuration substantially identical to that of an existing through-hole-type socket is had, it is less expensive than a surface-mounted socket of a probe-pin type. Moreover, by offsetting a board-side contact portion from a through hole of the board and moving the board-side contact portion in a horizontal direction, the board-side contact portion can perform wiping with an edge portion of the through hole and contact failure due to foreign matter or the like can be prevented.

BRIEF DESCRIPTION OF DRAWINGS

So that those having ordinary skill in the art to which the disclosed system appertains will more readily understand how to make and use the same, reference may be had to the following drawings.

DESCRIPTION OF EMBODIMENTS

Figure 1:
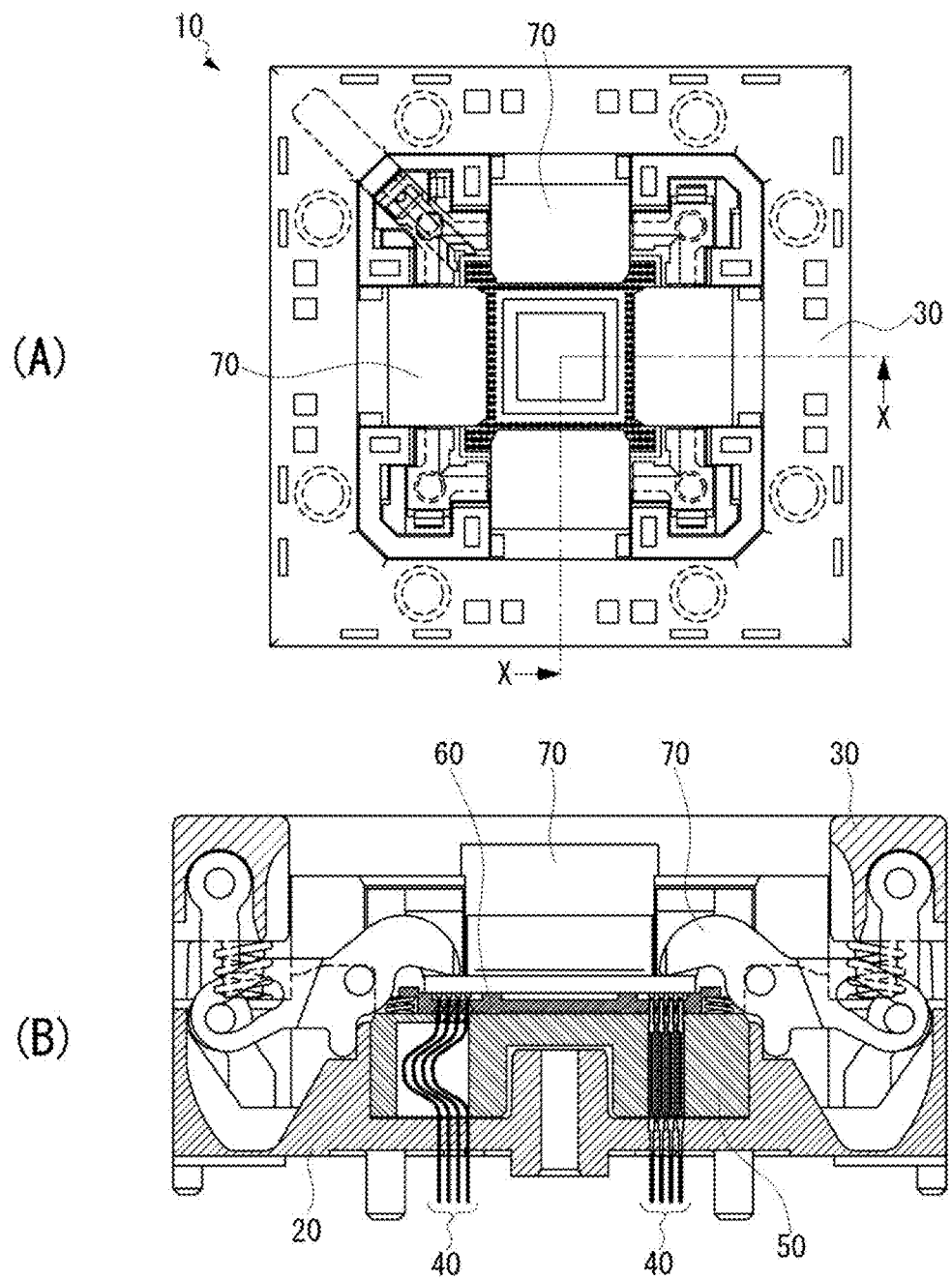
FIG. 1 is a plan view of a conventional socket (A), and a diagram illustrating a cross section thereof at line X-X (B).
Figure 2:
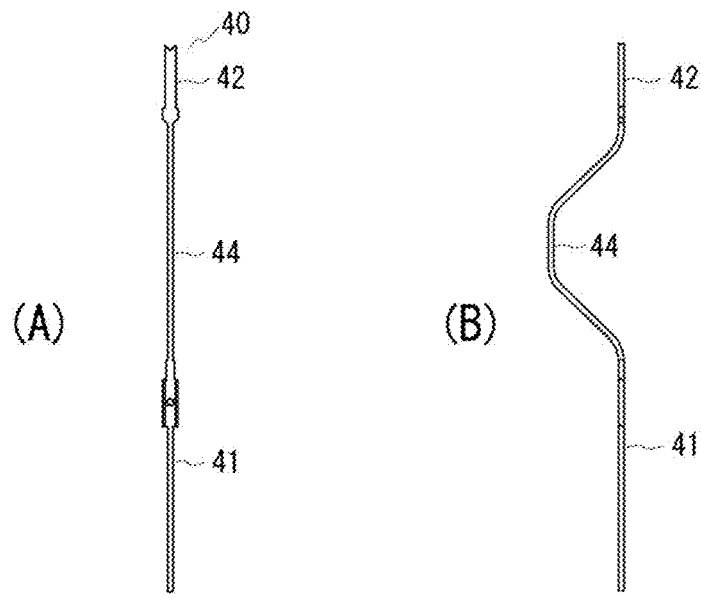
FIG. 2 is a plan view of a contact of the conventional socket (A), and a side view of the contact (B).
Figure 3:
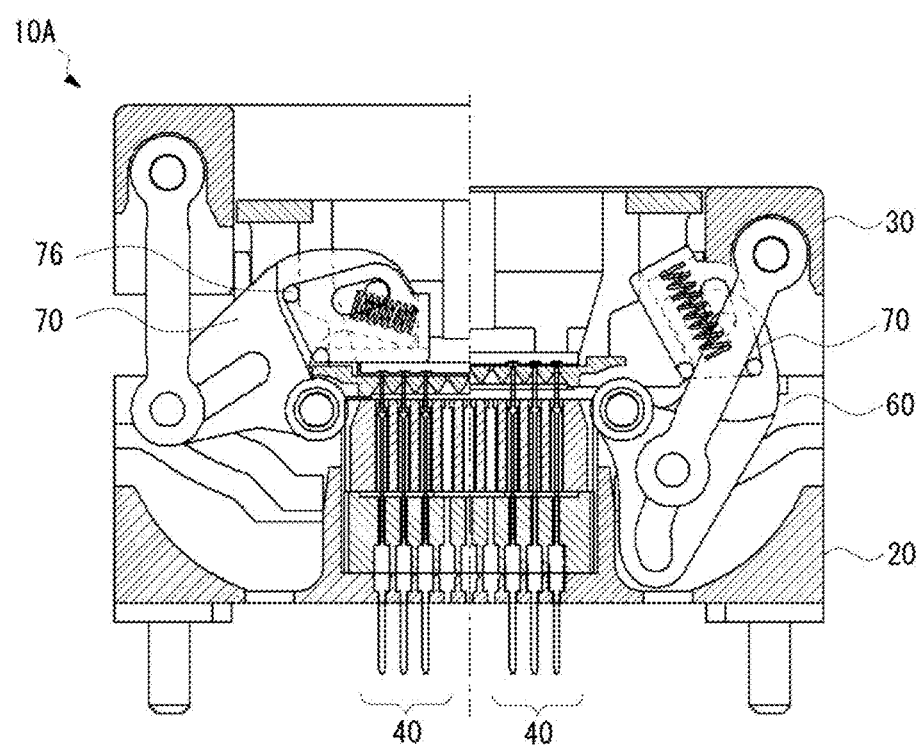
FIG. 3 is a cross-sectional view illustrating a configuration of another conventional socket.
Figure 4:
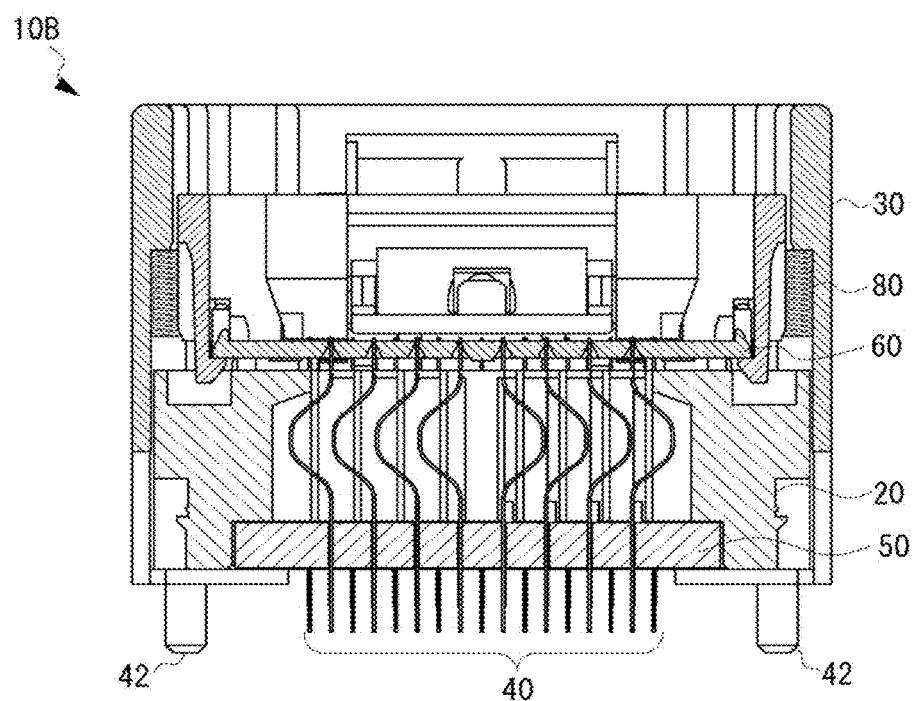
FIG. 4 is a cross-sectional view illustrating a schematic configuration of a conventional through-hole-type socket.

A preferred embodiment of the present technology is described in detail below with reference to the drawings.

FIGS. 7 to 11 are perspective views illustrating a schematic configuration of a surface-mountable socket of an example of the present technology. The socket of the present example is made from a plurality of contacts 110 that provides an electrical connection between a BGA semiconductor device or another semiconductor device (a semiconductor package or an IC chip) and a board, a stopper member 120 that aligns and holds an end portion of the contact 110 on a board side, a base member 130 that positions and fixes the stopper member 120 and aligns and holds an end portion of the contact 110 on an IC side, a cover member 140 that can move in a direction heading toward or away from the base member 130 and is biased in the direction heading away from the base member by a coil spring, a latch member 150 that presses an upper face of the semiconductor device and causes a terminal of the semiconductor device to contact the contact, a link member 160 that rotates and drives the latch member 150 in conjunction with movement of the cover member 140, a floating/adapter member 170 whereon the semiconductor device is placed that guides the end portion of the contact 110 so the end portion of the contact 110 contacts the terminal of the semiconductor device, a guide member 180 that aligns the end portion of the contact 110 on the board side, and an insertion nut 190 that serves as a female screw when screwing the socket and the board together.

Configurations and operations of the cover member 140, the latch member 150, the link member 160, and the floating/adapter member 170 of the socket are disclosed in patent literatures 1 and 2 and the like, and detailed description thereof is omitted. Moreover, it is sufficient for the socket of the present example to have a configuration that can mount a BGA semiconductor device or another semiconductor device, and the cover member 140, the latch member 150, the link member 160, and the floating/adapter member 170 do not necessarily need to be provided.

Figure 5:
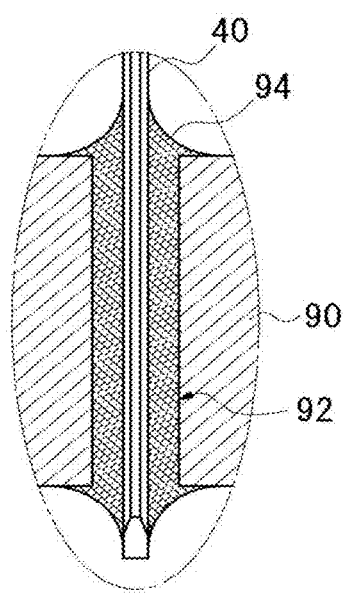
FIG. 5 is a cross-sectional view illustrating a contact of the socket being soldered in a through hole of a circuit board.
Figure 6:
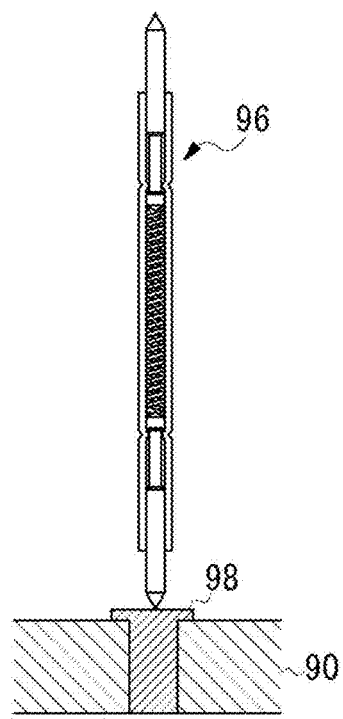
FIG. 6 is a diagram for describing a method of connecting to a pad of the circuit board by a conventional probe pin.
Figure 7:
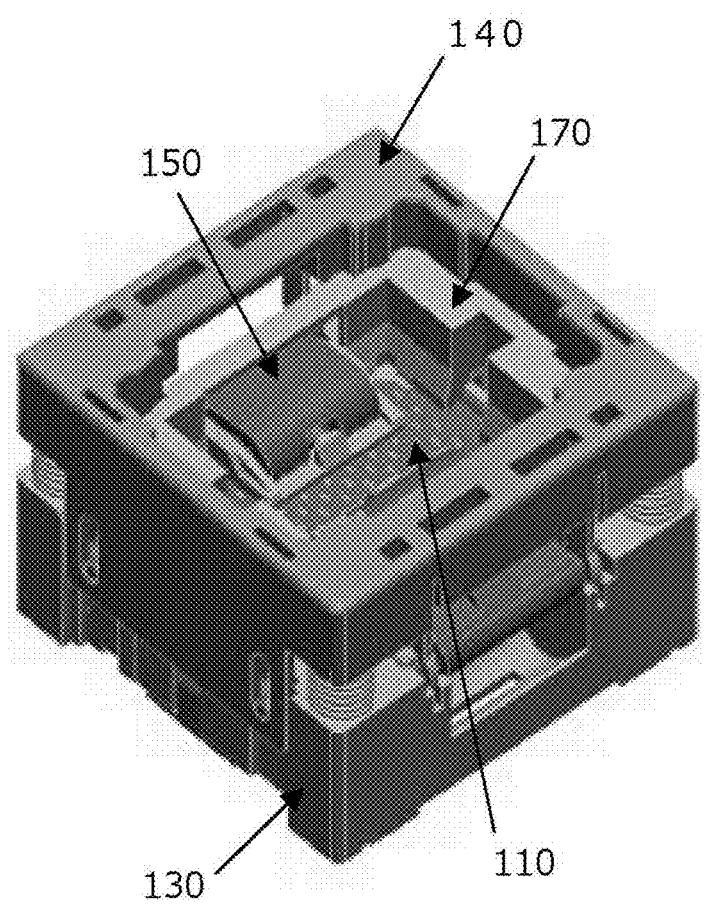
FIG. 7 is a perspective view from above of a socket of a surface-mounted type of an example of the present technology.
Figure 8:
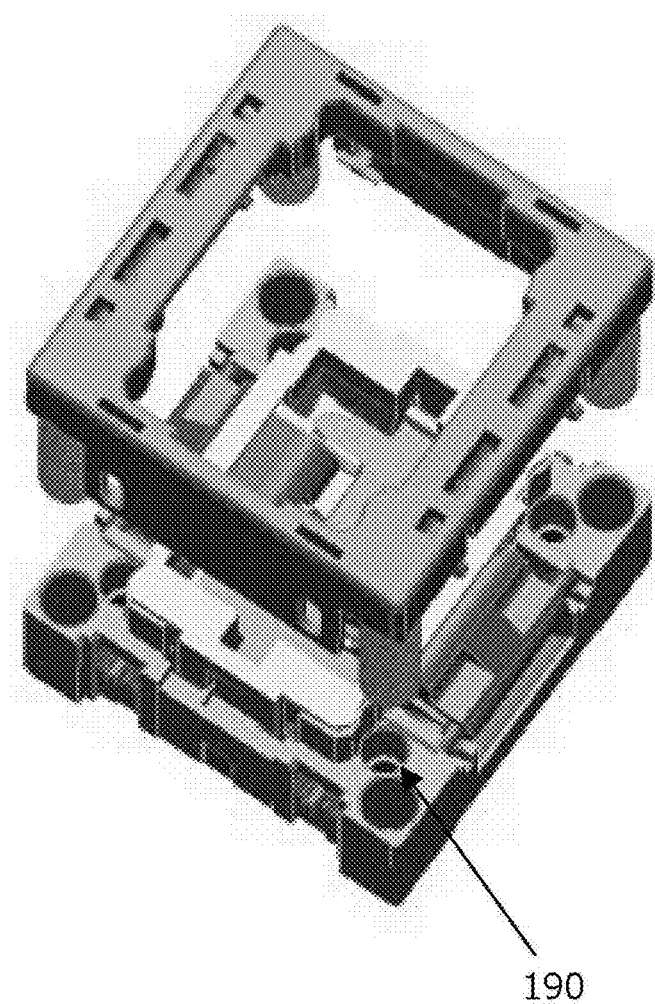
FIG. 8 is an exploded perspective view of the socket of the surface-mounted type of the example of the present technology.
Figure 9:
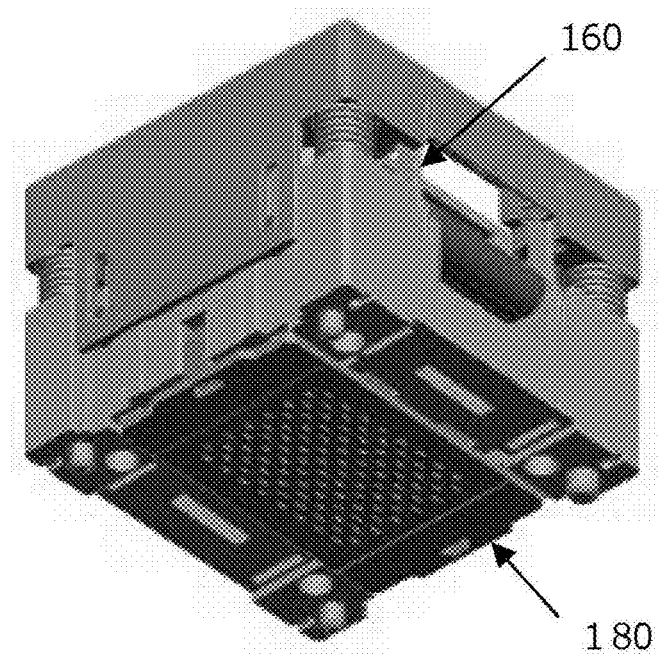
FIG. 9 is a perspective view from below of the socket of the surface-mounted type of the example of the present technology.
Figure 10:
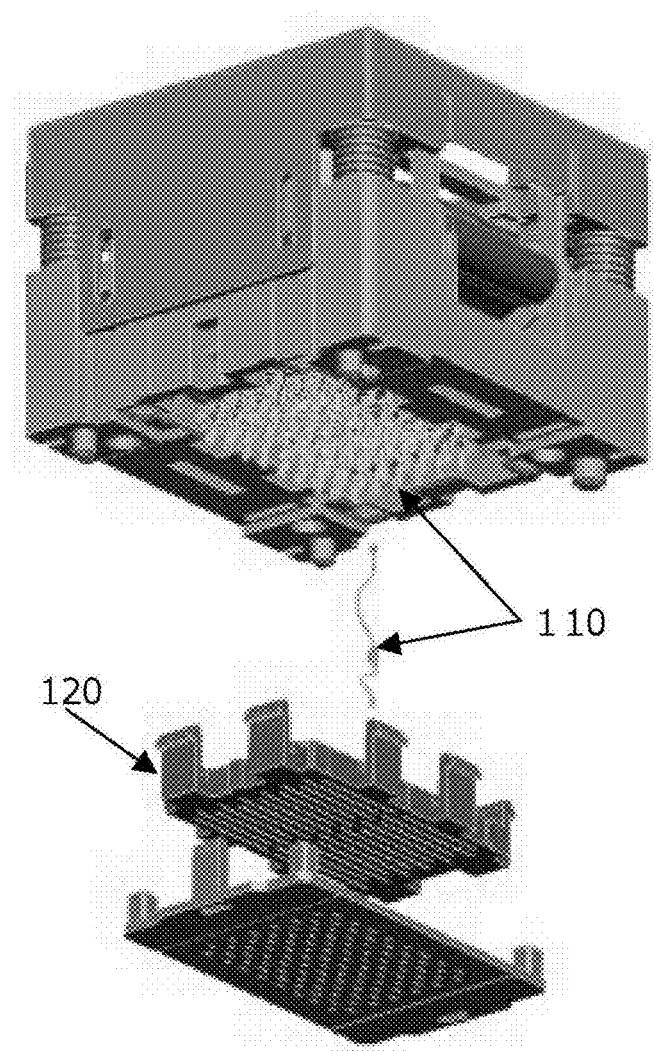
FIG. 10 is an exploded perspective view of the socket of the surface-mounted type of the example of the present technology.
Figure 11:
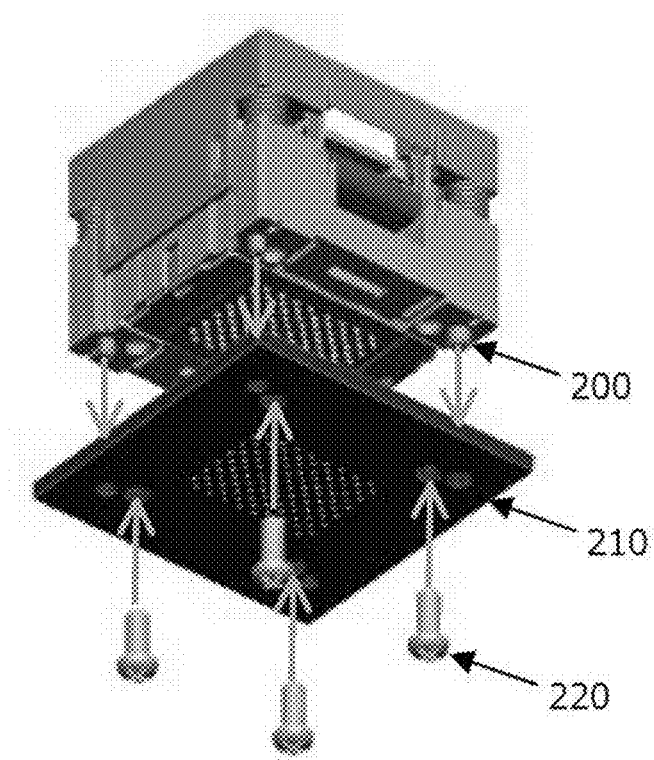
FIG. 11 is a diagram for describing a connection between the socket of the surface-mounted type of the example of the present technology and a board.
Figure 12:
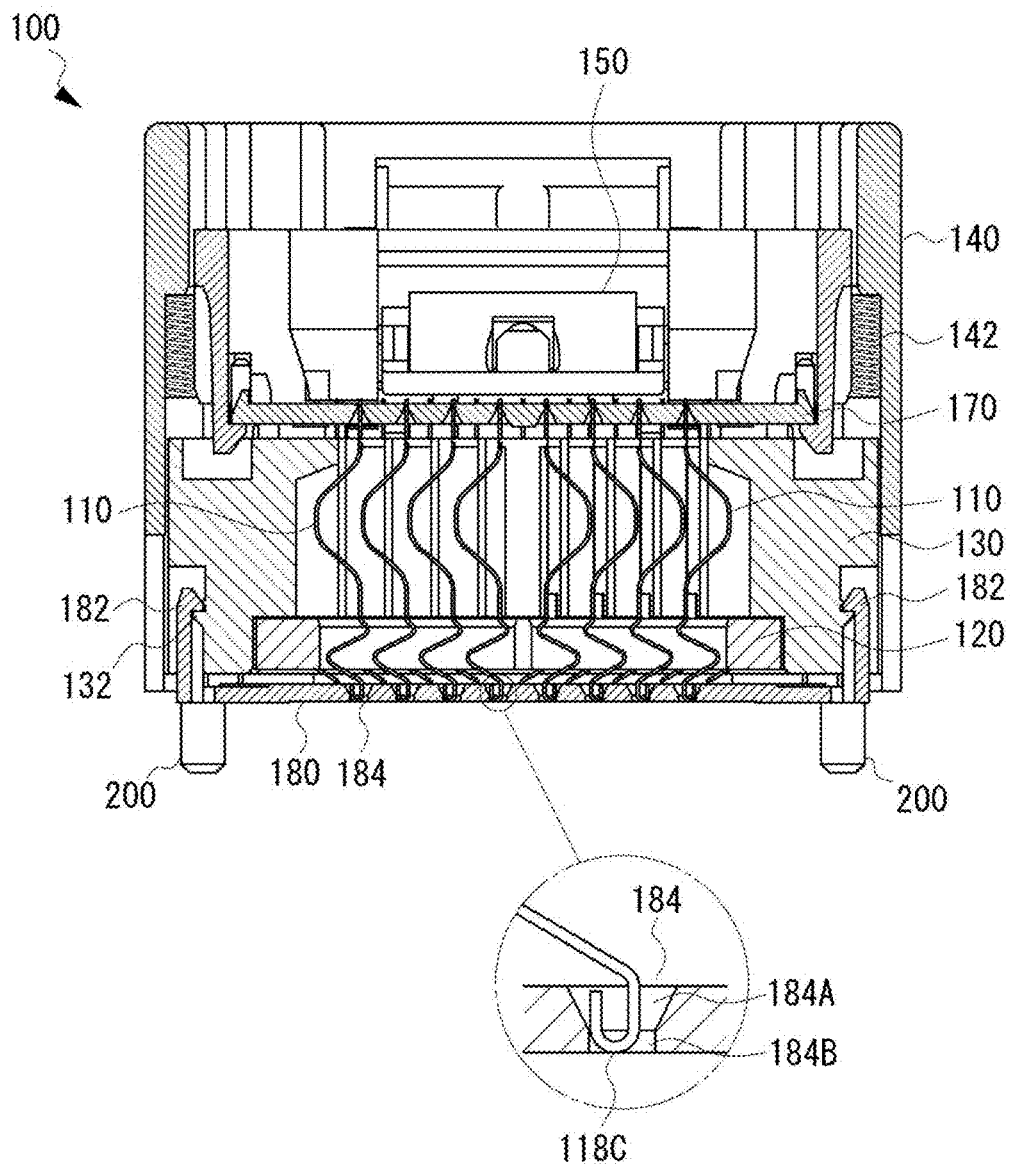
FIG. 12 is a cross-sectional view illustrating a schematic configuration of the socket of the surface-mounted type of the example of the present technology.

FIG. 12 is a cross-sectional view illustrating the schematic configuration of the socket of the present example. A socket 100 of the present example is provided with an interface structure where surface-mounting to the board is possible, and by this, mounting to an existing through-hole-type board is also possible. Normally, as illustrated in FIG. 5, a board of a through-hole type inserts a contact of a socket into a through hole, but the interface structure of the present example enables contact with a conductive region of a board surface including a through hole without substantially inserting a contact into the through hole.

As illustrated in this diagram, in the socket 100 of the present example, included as the interface structure for enabling surface-mounting to the board are the plurality of contacts 110; the stopper member 120, which is installed in a central opening of the base member 130; and a lead-guide member 180, which is installed below the stopper member 120.

Figure 12A:
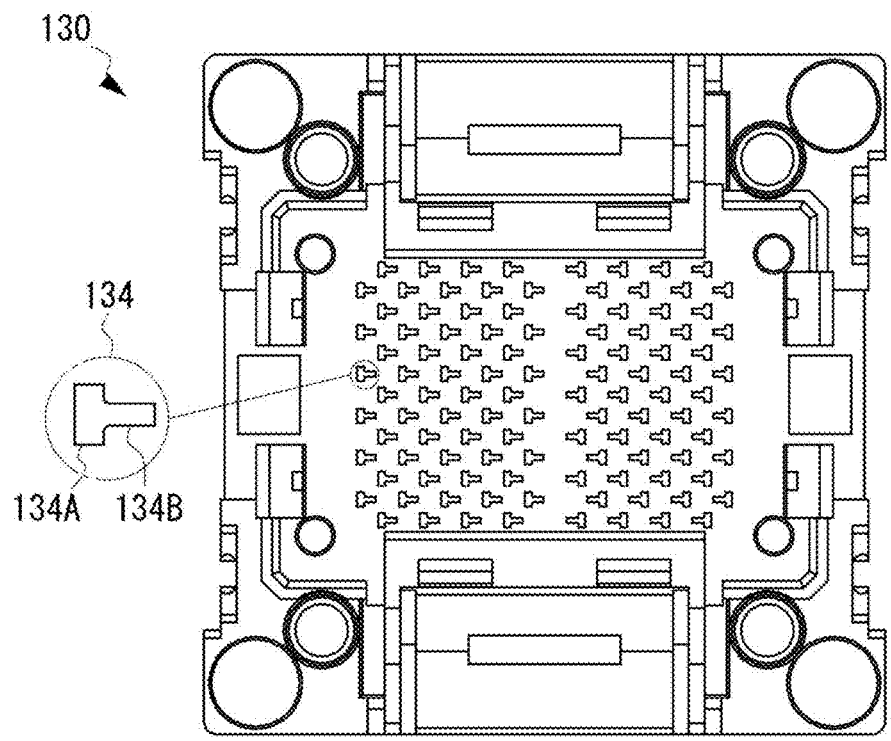
FIG. 12A is a plan view of a base member (A), and a side view including a partial cross section of the base member (B).
Figure 12A:
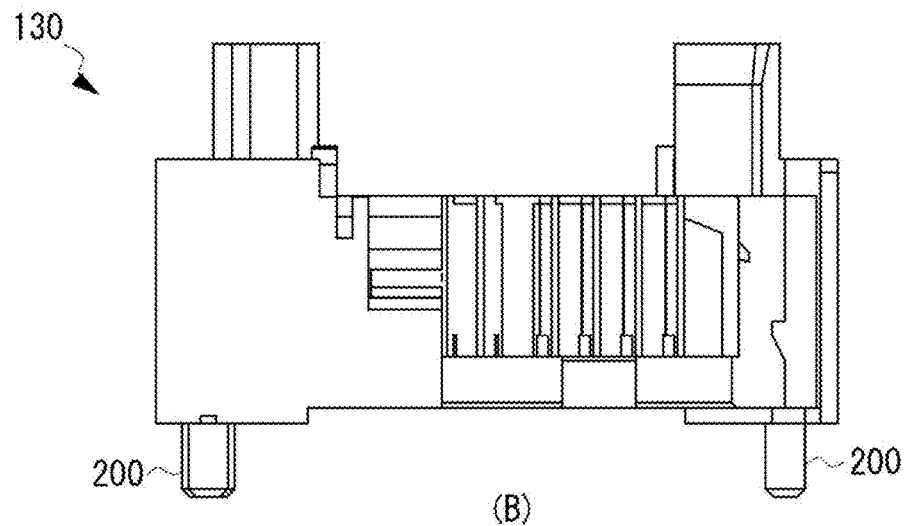

FIG. 12A illustrates a plan view of the base member 130 and a side view including a partial cross section of the base member 130. Inside the base member 130 is formed a plurality of spaces partitioned by a plurality of walls for aligning and holding the plurality of contacts 110, and a surface thereof is formed with a plurality of opening portions 134 connected to this plurality of spaces. The opening portion 134 includes a wide portion 134A and an extended portion 134B that extends from the wide portion 134 in an orthogonal direction. A configuration is such that when the contact 110 is held in the base member 130, a distal end portion of the contact 110 protrudes from the wide portion 134A of the opening portion 134.

Figure 13:
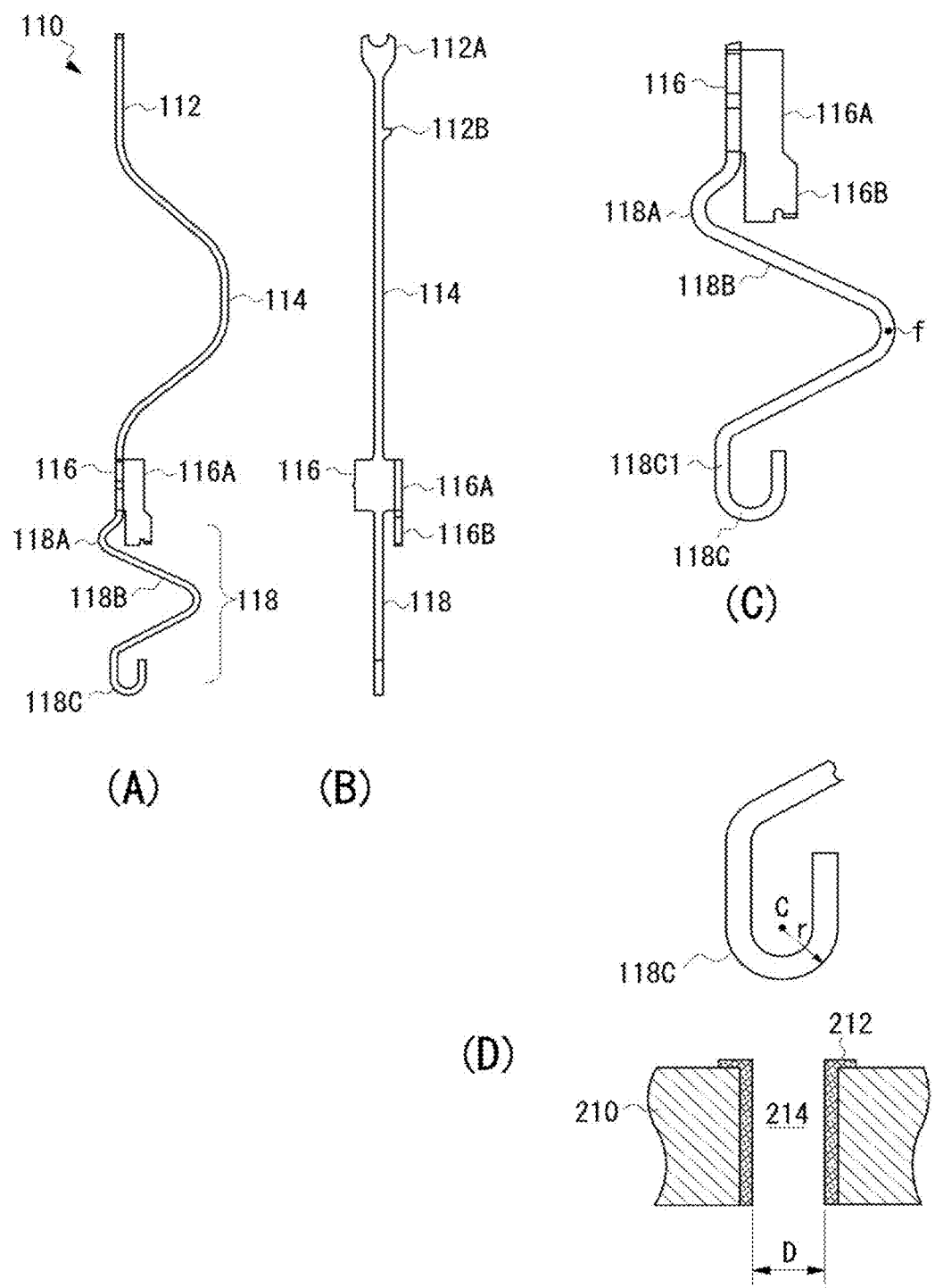
FIG. 13 is an illustration of a contact of the example of the present technology: (A) is a front view of the contact, (B) is a side view of the contact, (C) is an enlarged view of a board-side contact, (D) is a diagram for describing a relationship between the board-side contact and a through hole of the board.

In FIG. 13, (A) illustrates an enlarged front view of the contact, (B) illustrates a side view of the contact, (C) illustrates an enlarged view of a board-side contact, and (D) illustrates a relationship between the board-side contact and a through hole of the board. A desired shape of the contact 110 of the present example is obtained by subjecting a plate material made of a conductive metal material such as beryllium copper or a copper alloy to stamping, etching, or the like. The contact 110 extends in roughly an axial direction, and one end portion thereof configures a contact portion 112 that connects to the terminal of the semiconductor device. The contact portion 112 includes a distal end portion 112A that contacts a ball terminal formed on a bottom face of the semiconductor device (for example, a BGA device) and a protruding portion 112B that protrudes sideways from the axial direction. By passing the distal end portion 112A through the wide portion 134A of the opening portion 134 of the base member 130 and pushing the distal end portion 112A in a direction of the extended portion 134 upon passing through, the protruding portion 112B fixes an upper direction in a groove of the extended portion 134B and a preload is imparted to the contact 110. The floating/adapter member 170 is disposed on the base member 130, and a through hole formed in the floating/adapter member 170 is aligned with a position of the opening portion 134 of the base member 130. The contact portion 112 protruding from the surface of the base member 130 is housed in the through hole of the floating/adapter member 170. When the floating/adapter member 170 is pressed downward by the latch member 150 via the semiconductor device, the contact portion 112 is guided in the through hole and protrudes from a surface of the floating/adapter member 170. The cover member 140 is biased in the direction heading away from the base member 130 by a spring coil 142, and the floating/adapter member 170 moves in conjunction with the cover member 140 and the latch member 150 via the link member 160: when the cover member 140 is lowered, the latch member 150 opens and the floating/adapter member 170 rises, and when the cover member 140 rises, the latch member 150 closes and the floating/adapter member 170 descends.

The contact 110 further includes an elastically deforming portion 114 that is connected to the contact portion 112 and bent to a roughly U-shaped side. By the elastically deforming portion 114 flexing, a certain contact pressure is imparted between the contact portion 112 and the terminal of the semiconductor device. The contact 110 further includes a locking portion 116 that extends in the axial direction from the elastically deforming portion 114. The locking portion 116 is fixed by the stopper member 120, which is described below. In one example, the locking portion 116 includes a wide portion with a wide width and further includes a bent portion 116A that is bent substantially at a right angle from the wide portion and a wide section 116B that extends downward from the bent portion 116A.

Further connected to the locking portion 116 is a board-side contact 118 that contacts a conductive region such as an electrode on a board side. The board-side contact 118 includes a protruding portion 118A that protrudes somewhat from the axial direction, an elastically deforming portion 118B that protrudes in an opposite direction of the protruding portion 118A and is bent in roughly a V shape, and a board-side contact portion 118C that is connected to the elastically deforming portion 118 and contacts the board. The board-side contact portion 118C includes an extended portion 118C1 that extends in substantially the same axial direction as the locking portion 116, and the extended portion 118C1 has a shape of being bent substantially 180 degrees. When a load is applied in a direction of compressing the board-side contact portion 118C, the board-side contact portion 118C rotates and moves with a bend portion f of the elastically deforming portion 118 as a fulcrum.

Figure 14:
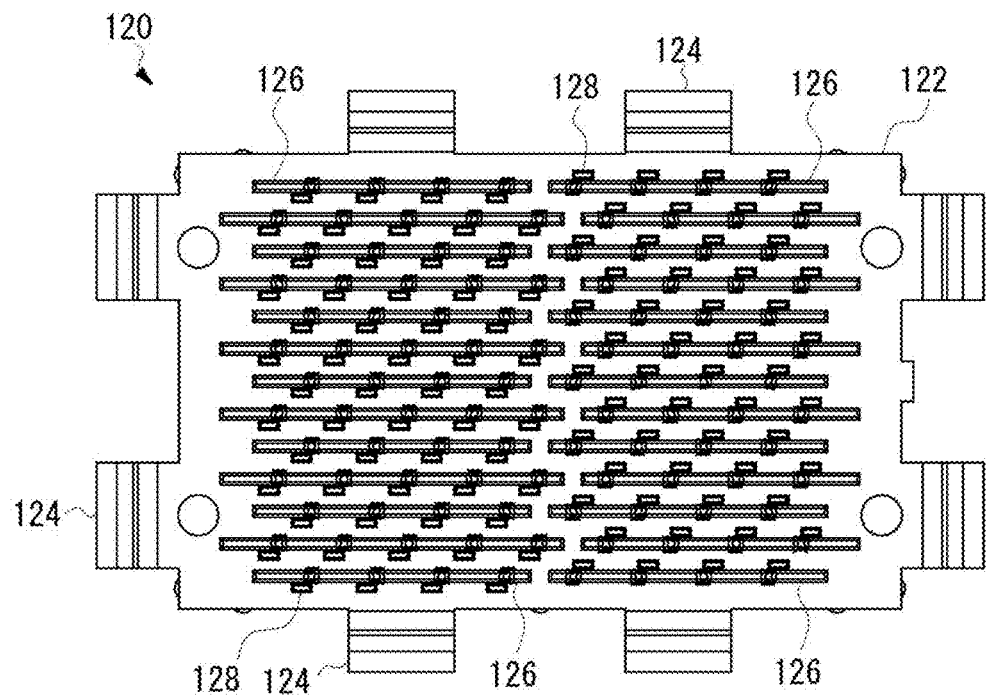
FIG. 14 is a plan view of a stopper member of the example of the present technology.

The base 130 is formed with the plurality of spaces partitioned by the plurality of walls to align and hold the plurality of contacts 110; the stopper member 120 is installed from a bottom-portion side of the base member 130 so this space is closed. FIG. 14 is a plan view of the stopper member 120. The stopper member 120 includes a main body portion 122 that provides a roughly rectangular face and a plurality of leg portions 124 formed on a side portion of the main body portion 122. The plurality of leg portions 124 is inserted into an installation hole of the base member 130 and fixes the stopper member 120 to the base member 130.

The main body portion 122 has a plurality of elongated grooves 126 formed in a two-dimensional manner. A width of the elongated groove 126 in a transverse direction is only somewhat greater than a width of the contact 110, and movement of the contact 110 in the transverse direction is regulated by this width in the transverse direction. Moreover, a plurality of locking grooves 128 is formed along the plurality of elongated grooves 126; when a plurality of board-side contacts 118 is inserted into the elongated groove 126, the wide section 116B of the locking portion 116 is locked in the locking groove 128. In this example, four or five contacts are aligned in one elongated groove 126, and as such, four or five locking grooves 128 are formed along one elongated groove 126.

A depth at which the elongated groove 126 penetrates the main body portion 122 is constant, and this depth is roughly equal to a length, in the axial direction, of the elastically deforming portion 118B of the board-side contact 118. Because of this, the board-side contact portion 118C of the board-side contact 118 protrudes from a bottom face of the stopper member 120.

Figure 14A:
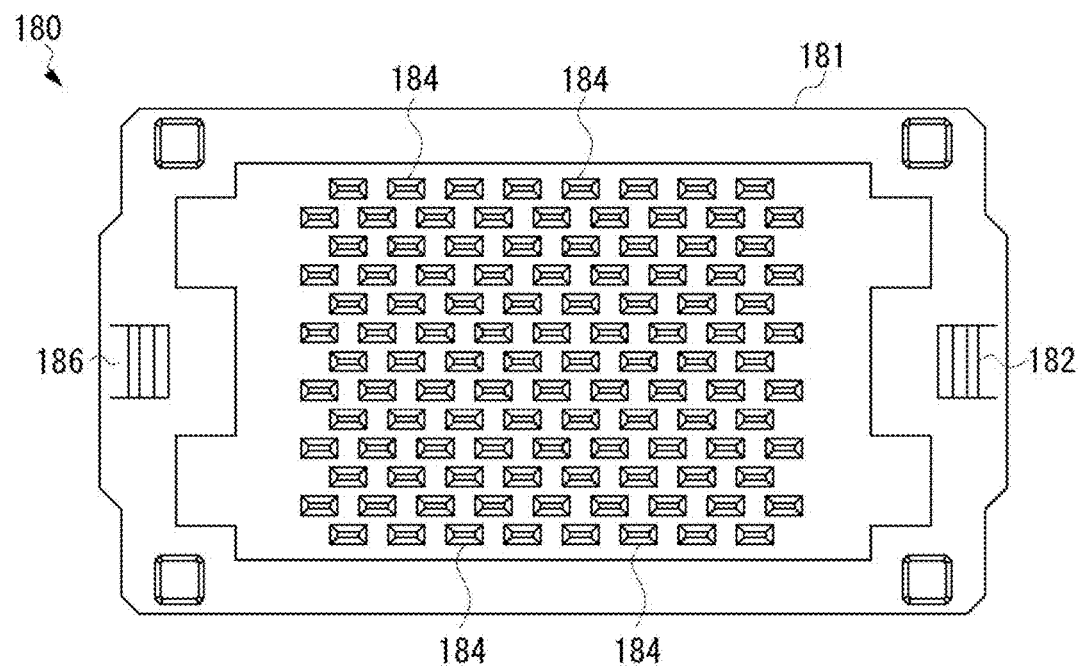
FIG. 14A is a plan view of a guide member of the example of the present technology.
Figure 15:
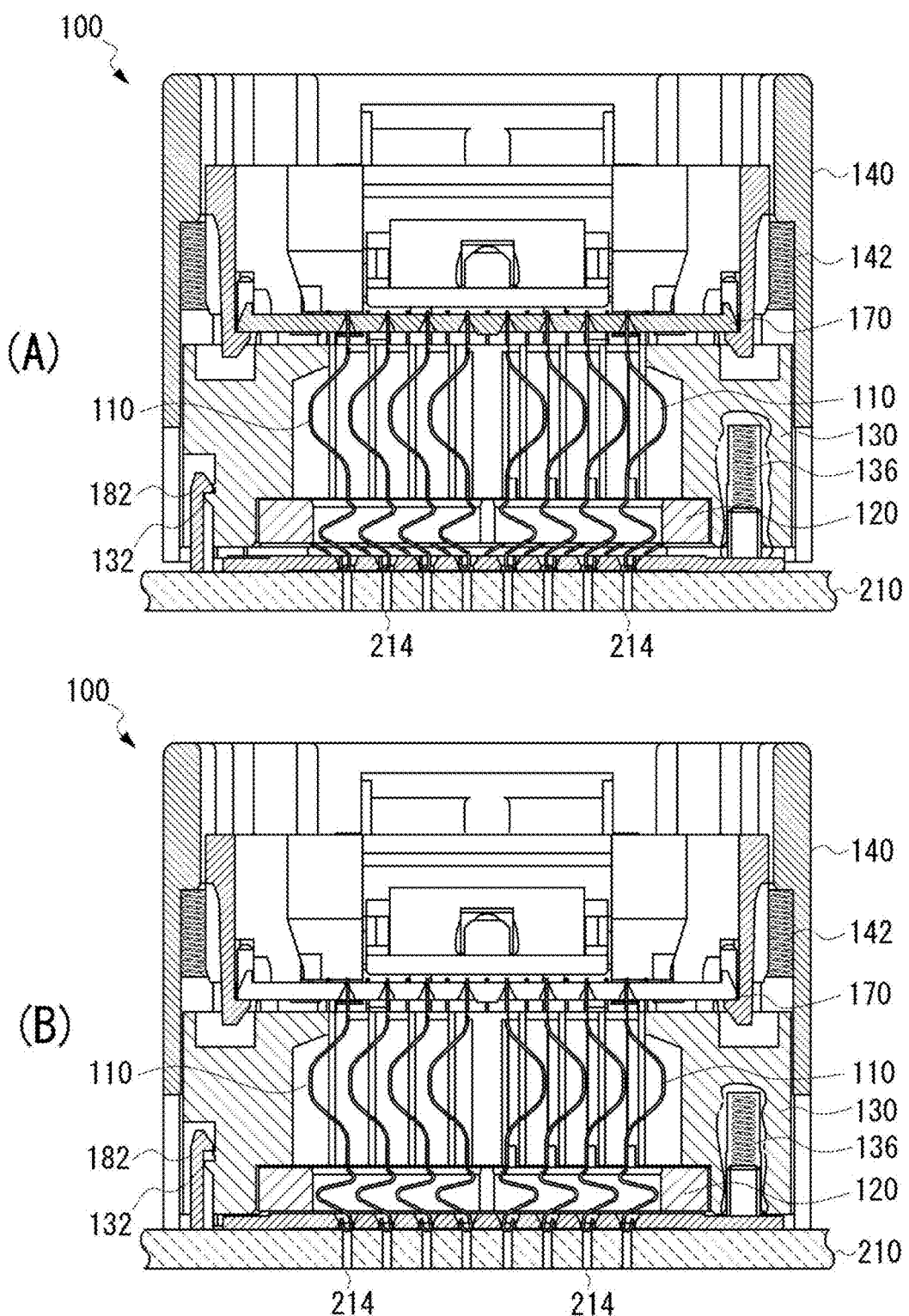
FIG. 15 is a schematic cross-sectional view illustrating a state where the socket is installed on the board (A), and a schematic cross-sectional view illustrating a state when the socket is pressed to the board (B).

The guide member 180 is installed to the base member 130 so as to oppose the stopper member 120. FIG. 14A is a plan view of the guide member 180. As illustrated in this diagram, the guide member 180 includes a main body portion 181 that provides a rectangular face and a plurality of leg portions 182 formed on a side portion of the main body portion 181. A hook is formed on each distal end of the plurality of leg portions 182, and the hook can engage with a hook 132 formed on a sidewall of the base member 130 (see FIG. 12). In a preferred example, the guide member 180 is biased in the direction heading away from the base member 130 by a spring coil 136 (to illustrate the spring coil 136, a portion of FIG. 15 illustrates a different cross section) and the guide member 180 can move in the direction heading toward or away from the base member 130. When the leg portion 182 is in a state of being locked by the hook 132 of the base member, the guide member 180 is in a position the farthest away from the stopper member 120 and a certain interval is formed between the two.

In the main body portion 181 of the guide member 180, a plurality of through holes 184 is formed in a position aligned with the elongated groove 126 of the stopper member 120. In one example, as illustrated in FIG. 12, the through hole 184 includes a rectangular portion 184 whose diameter gradually narrows in heading toward a bottom face from a surface of the guide member 180 and a rectangular portion 184B that extends straight from the rectangular portion 184A at a constant inner diameter. The board contact portion 118C that protrudes from the bottom face of the stopper member 120 is inserted into the through hole 184;

when the guide member 180 is in a position the farthest away from the base member 130, a distal end of the substrate-side contact portion 118C is in a position substantially equal to the bottom face of the guide member 180 or protrudes somewhat past the bottom face.

As illustrated in (D) in FIG. 13, the board-side contact portion 118C is connected to the elastically deforming portion 118B, and the distal end thereof is bent in a circular shape or a U shape. To approximate the curved shape, a relationship of $2r<D$ is had when a curvature centre of the board-side contact portion 118C is defined as C, a curvature radius is defined as r, and a diameter of a through hole 214 of a board 210 is defined as D. In a situation where plating 212 is formed on the board surface and/or an inner wall of the through hole 214, the diameter D is an inner diameter excluding a film thickness of the plating 212. When a force in roughly the axial direction is applied to the board contact portion 118C, the bend portion f of the elastically deforming portion 118B bends further and the board-side contact portion 118C rotates and moves with the bend portion f as the fulcrum. By narrowing a width of a connection portion between the board-side contact portion 118C and the elastically deforming portion 118B, the board-side contact portion 118C may be made able to rotate with greater elasticity with the connection portion as a fulcrum. Moreover, the curvature centre C of the board-side contact portion 118C is disposed so as to be offset from a centre of the through hole 214 of the board 210.

Next, an operation when installing the socket of the present example to the board is described. First, with a location pin 200 protruding from a corner of a bottom face of the base member 130 as a guide, the pin 200 is inserted into a positioning hole of the board 210 and the socket 100 is installed on the board 210. (A) in FIG. 15 illustrates this state. Next, while pressing the socket 100 to the board 210, the socket is fixed by a screw 220 from a board rear-face side (see FIG. 11).

Figure 16:
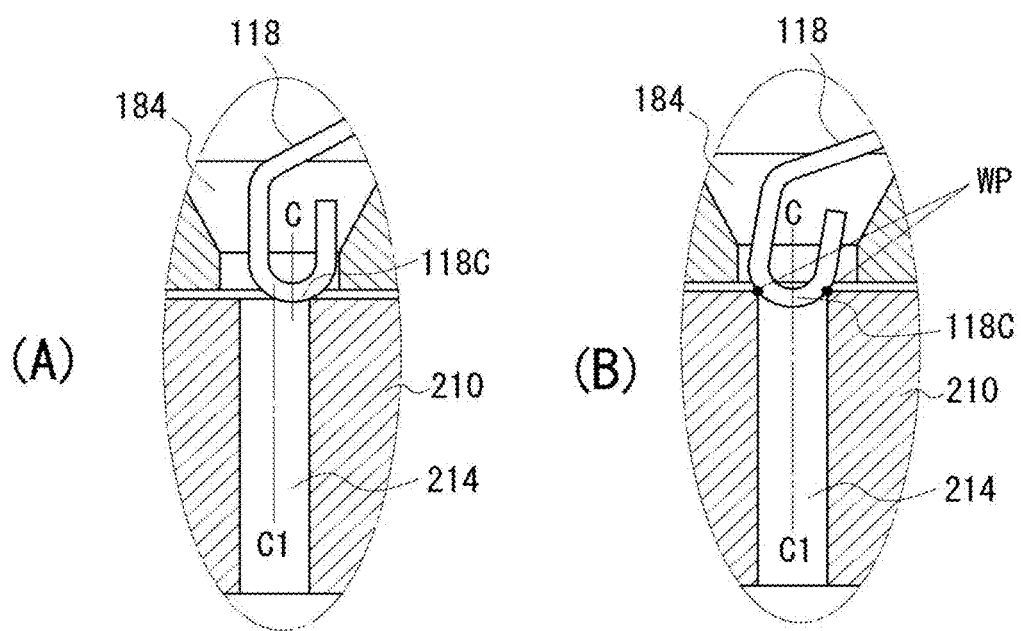
FIG. 16 is a diagram for describing a wiping operation of a board-side contact portion.

In a process of pressing the socket 100 to the board 210, the board-side contact portion 118C of the board-side contact 118 contacts the conductive region of the board surface while wiping the conductive region. (A) in FIG. 16 illustrates an initial position of the board-side contact portion 118C when the socket 100 is installed on the board 210. That is, as illustrated in (A) in FIG. 15, this is a state before pressing the socket 100 to the board 210; when the guide member 180 is in the position the farthest away from the base member 130, the curvature centre C of the board-side contact portion 118C is offset from a centre C1 of the through hole 214 of the board 210 and the board-side contact portion 118C contacts an edge portion of the through hole 214.

Next, when the socket 100 is pressed toward the board 210, the guide member 180 moves against an elasticity of the spring coil 136 in the direction heading toward the base member 130. At the same time, because the board-side contact portion 118C receives a force in the axial direction from the board surface and receives a force in a direction inclined from the axial direction from an edge of the through hole due to being offset, the board-side contact portion 118C rotates and moves around the fulcrum f of the elastically deforming portion 118B so as to slide on the board surface, and by this movement in a horizontal direction, the board-side contact portion 118C performs a wiping operation with an edge portion WP of the through hole 214 (see (B) in FIG. 16). Then, as above, the socket 100 and the board 210 are fixed by the screw 220. After the socket 100 is surface-mounted, a burn-in test or the like is performed in the same manner as a normal socket.

By being provided with the following characteristics, the socket of the present example can prevent a problem of contact failure due to foreign matter, which is a conventional problem.

a. The board-side contact portion contacts the edge portion of the through hole at many—two to four—points and performs wiping at the same time.
 b. An initial position of the distal end of the board-side contact portion is offset from the through hole.
 c. The curvature radius r of the board-side contact portion is greater than a radius of the through hole of the board and is coplanar with a spring portion.
 d. A direction orthogonal to the above is smaller (thinner) than the through-hole diameter.
 e. Spring portions on the IC side and the board side can move independently. Furthermore, the socket can be surface-mounted to an existing through-hole-type board. Moreover, when the socket fails, it can readily be replaced, which facilitates maintenance of a burn-in board.

Next, a second example of the present technology is described. In the second example, a surface of the board-side contact portion 118C is plated with the same material with which the inner wall of the through hole 214 and/or the surface of the board 210 is plated (see the plating 212 in (B) in FIG. 13) or a material that is softer than this. For example, the board-side contact portion 118C is Ag plating, and the through hole 214 of the board 210 is Ag plating or Au plating. By this, the plating on the board side can be prevented from becoming worn and a service life of the board can be increased.

Note that the board mounted with the socket may be a board of a single-layer wiring structure or a board of a multilayer wiring structure. Moreover, a shape and a material of the conductive region formed into the through hole of the board is not particularly limited; in short, a configuration is sufficient where the board-side contact portion 118C can electrically connect to the conductive region at the same time as contacting the through hole of the board.

Furthermore, the semiconductor device mounted to the socket is not particularly limited. In the examples above, it is a BGA package formed with solder balls, but it may be a semiconductor package (semiconductor device) for surface mounting other than this. Moreover, a shape of the terminal is not limited to being spherical, and the terminal may be a bump that is semicircular, conical, rectangular, or the like.

While detailed above is a preferred embodiment of the present technology, the present technology is not limited to a specific embodiment of the present technology and can be modified or changed in various ways within the scope of the gist of the present technology as given in the claims.

REFERENCE SIGNS LIST

100: Socket
110: Contact
112: Contact portion
114: Elastically deforming portion
116: Locking portion
118: Board-side contact
118A: Protruding portion
118B: Elastically deforming portion
118C: Board-side contact portion
120: Stopper member 130: Base member
140: Cover member
180: Guide member
210: Board
214: Through hole

The invention claimed is:

1. A socket that can be surface-mounted to a board, comprising:
   a plurality of contacts configured from a conductive material, each one of the plurality of contacts including:
      a contact portion having a distal end portion that can contact a terminal of a semiconductor device,
      a locking portion connected to the contact portion, and
      a board-side contact portion that extends from the locking portion and can contact a conductive region formed on a board surface;
   a holding member that holds the locking portion of the plurality of contacts; and
   a guide member that is disposed so as to oppose the holding member and is formed with a plurality of through holes into which of the board-side contact portion of the plurality of contacts, which protrudes from the holding member, is inserted;
   wherein the contact portion further includes a protruding portion spaced from the distal end portion and extending from a surface of the contact portion in an axial direction for engaging an opening of the holding member, the opening of the holding member comprising a first portion and a second portion extending from the first portion in an orthogonal direction, and wherein the protruding portion of the contact portion is configured to engage the second portion of the opening; and
   wherein the guide member can move in a direction heading toward or away from the holding member.

2. The socket of claim 1, wherein the board-side contact portion moves in an axial direction and a direction perpendicular to the axial direction when a force is received in the axial direction.

3. The socket of claim 2, wherein the board-side contact portion rotates and moves.

4. The socket of claim 1, wherein the board-side contact portion includes an elastically deforming portion connected to the locking portion and a curved portion connected to the elastically deforming portion.

5. The socket of claim 4, wherein the board-side contact portion rotates and moves with the elastically deforming portion as a fulcrum.

6. The socket of claim 1, wherein the board-side contact portion is larger than a diameter of a through hole of the board.

7. The socket of claim 1, wherein a centre of the board-side contact portion is offset from a centre of a through hole of the board.

8. The socket of claim 1, wherein a curvature radius of the board-side contact portion is greater than a radius of a through hole of the board.

9. The socket of claim 1, wherein the board-side contact portion includes a portion with a relatively narrow width.

10. The socket of claim 1, wherein a material equally soft as or softer than a material plating a through hole of the board or the board surface of the through hole is selected as a material plating a surface of the board-side contact portion.

11. The socket of claim 10, wherein the material plating the surface of the board-side contact portion is silver (Ag) plating, and the material plating the through hole of the board or the board surface of the through hole is gold (Au) plating.

12. The socket of claim 1, wherein the socket further includes a spring means of biasing the guide member in the direction heading away from the holding member.

13. A mounting device comprising:
   a board; and
   a socket surface-mounted to the board, wherein the socket includes:
      a plurality of contacts configured from a conductive material, each one of the plurality of contacts including a contact portion having a distal end portion that can contact a terminal of a semiconductor device, a locking portion connected to the contact portion, and a board-side contact portion that extends from the locking portion and can contact a conductive region formed on a board surface;
      a holding member that holds the locking portion of the plurality of contacts; and
      a guide member that is disposed so as to oppose the holding member and is formed with a plurality of through holes into which the board-side contact portion of the plurality of contacts, which protrudes from the holding member, is inserted;
   wherein the contact portion further includes a protruding portion spaced from the distal end portion and extending from a surface of the contact portion in an axial direction for engaging an opening of the holding member, the opening of the holding member comprising a first portion and a second portion extending from the first portion in an orthogonal direction, and wherein the protruding portion of the contact portion is configured to engage the second portion of the opening; and
   wherein the guide member can move in a direction heading toward or away from the holding member.

14. The mounting device of claim 13, wherein the mounting device is a device for testing.

15. The mounting device of claim 13, wherein the board-side contact portion makes multiple contact with an edge portion of the through hole of the board.

* * * * *